United States Patent
Frank et al.

(10) Patent No.: US 8,801,865 B2
(45) Date of Patent: Aug. 12, 2014

(54) DEVICE AND PROCESS FOR WET TREATING A PERIPHERAL AREA OF A WAFER-SHAPED ARTICLE

(75) Inventors: Dieter Frank, Villach (AT); Jurgen Parzefall, Villach (AT); Alexander Schwarzfurtner, Moosburg (AT)

(73) Assignee: Lam Research AG, Villach (AT)

( * ) Notice: Subject to any disclaimer, the term of this patent is extended or adjusted under 35 U.S.C. 154(b) by 196 days.

(21) Appl. No.: 12/743,474

(22) PCT Filed: Nov. 12, 2008

(86) PCT No.: PCT/EP2008/065371
§ 371 (c)(1),
(2), (4) Date: May 18, 2010

(87) PCT Pub. No.: WO2009/065757
PCT Pub. Date: May 28, 2009

(65) Prior Publication Data
US 2010/0288312 A1    Nov. 18, 2010

(30) Foreign Application Priority Data
Nov. 23, 2007 (AT) .............................. A 1906/2007

(51) Int. Cl.
*B08B 7/04* (2006.01)
*B08B 5/04* (2006.01)
*B08B 3/00* (2006.01)

(52) U.S. Cl.
USPC ................... 134/26; 134/10; 134/21; 134/28; 134/29

(58) Field of Classification Search
None
See application file for complete search history.

(56) References Cited

U.S. PATENT DOCUMENTS

| | | | |
|---|---|---|---|
| 5,513,668 A | 5/1996 | Sumnitsch | |
| 5,762,391 A | 6/1998 | Sumnitsch | |
| 6,015,467 A * | 1/2000 | Nagasawa et al. | 134/1 |
| 6,186,873 B1 * | 2/2001 | Becker et al. | 451/54 |
| 6,435,200 B1 | 8/2002 | Langen | |
| 2005/0242064 A1* | 11/2005 | Saito et al. | 216/92 |
| 2006/0081270 A1 | 4/2006 | Woods et al. | |
| 2006/0185792 A1 | 8/2006 | Yashiki et al. | |
| 2007/0062647 A1 | 3/2007 | Bailey et al. | |
| 2008/0190451 A1* | 8/2008 | Goto | 134/6 |
| 2008/0216867 A1* | 9/2008 | Hsu et al. | 134/6 |

FOREIGN PATENT DOCUMENTS

| | | |
|---|---|---|
| JP | 2003-286597 A | 10/2003 |
| JP | 2006120666 A | 5/2006 |
| JP | 2006-253329 A | 9/2006 |
| WO | 03/023825 A2 | 3/2003 |

OTHER PUBLICATIONS

International Search Report, dated Feb. 16, 2009, from corresponding PCT application.

* cited by examiner

*Primary Examiner* — Nicole Blan
(74) *Attorney, Agent, or Firm* — Young & Thompson

(57) ABSTRACT

A method and device for wet treating a peripheral area of a wafer-shaped article uses rollers for driving the wafer-shaped article at its edge. First and second liquid treatment units supply liquid towards the peripheral area. Each of the liquid treatment units comprises a liquid carrier, a liquid supply nozzle for supplying liquid to the liquid carrier and a liquid discharging channel for removing liquid from the liquid carrier. The second liquid treatment unit includes a gas treatment section with a gas supply nozzle for removing most of the second liquid from the peripheral area, and with a gas discharge channel for discharging gas and removed liquid.

6 Claims, 3 Drawing Sheets

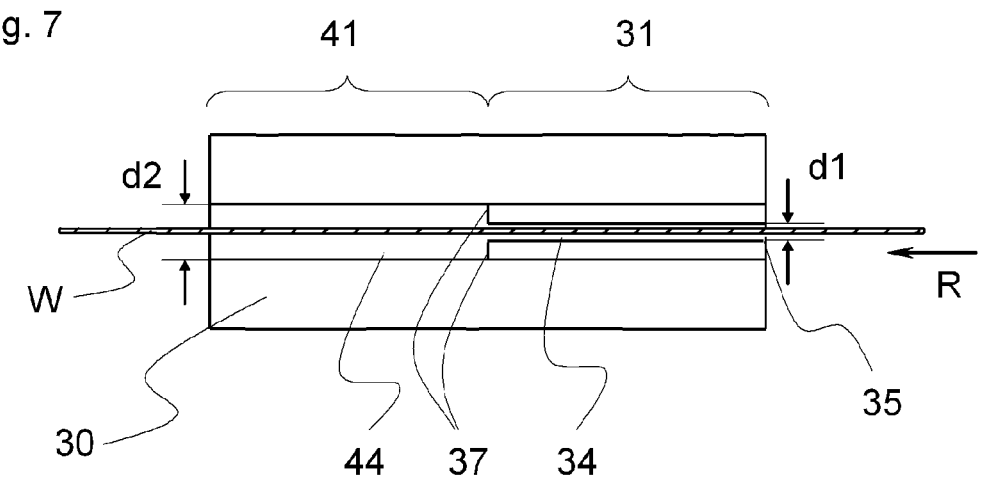
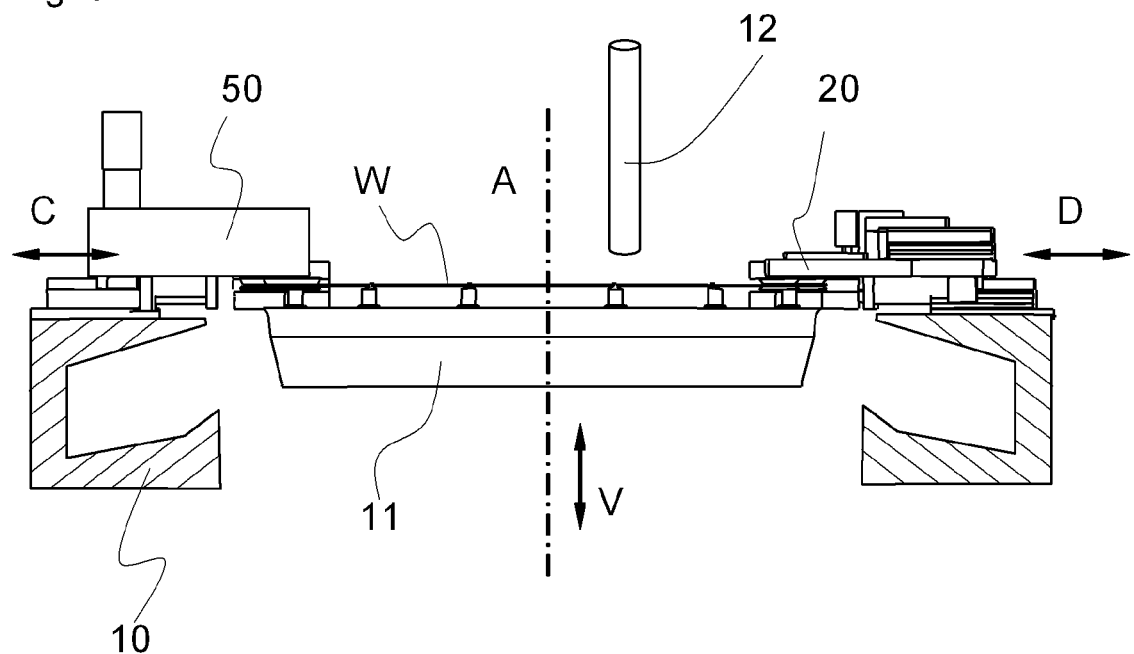

DEVICE AND PROCESS FOR WET TREATING A PERIPHERAL AREA OF A WAFER-SHAPED ARTICLE

TECHNICAL FIELD

The invention relates to a device and process for wet treating a peripheral area of a wafer-shaped article

BACKGROUND ART

U.S. Pat. No. 6,435,200 discloses an apparatus for etching a peripheral region of the disc-like article. The liquid is supplied to the surface of the disc-like article which does not face the chuck and is held in a gap between the disc-like article and a ring.

For specific application a mechanical force is advantageous in order to properly treat the peripheral region, e.g. in order to remove a specific layer from the peripheral region. Sometimes very aggressive compositions must be used for properly removing a specific layer. Furthermore such compositions may harm the apparatus.

WO2003/023825A2 discloses an apparatus for etching a peripheral region of a wafer-shaped article. Liquid is supplied at a single point and is removed immediately thereafter. Only one liquid can be supplied at one time. If the liquid is not properly removed the driving rollers come into contact with the aggressive liquid The object of the invention is to provide a device for treating a peripheral area of a wafer-shaped article, which is able to intensively treat the peripheral area and which protects the machine parts of the contact with harmful compositions and which is more flexible.

DISCLOSURE OF INVENTION

The invention meets the objects by providing a device for wet treating a peripheral area of a wafer-shaped article. The device comprises holding means for holding and rotating the wafer-shaped article at its edge, a first liquid treatment unit for supplying liquid towards the peripheral area, and a second liquid treatment unit for supplying liquid towards the peripheral area.

The holding means comprise rollers for driving the wafer-shaped article at its edge. At least one of the rollers is driven by a motor. The rollers may have circumferential grooves so that the wafer-shaped article can be securely fixed in axial position.

The first liquid treatment unit comprises a first liquid carrier for providing a first liquid to wet a first section of the peripheral area, a first liquid supply nozzle for supplying liquid to the first liquid carrier, and a first liquid discharging channel for removing liquid from the first liquid carrier.

The second liquid treatment unit comprises, a second liquid carrier for providing a second liquid to wet a second section of the peripheral area, a second liquid supply nozzle for supplying liquid to the second liquid carrier, a second liquid discharging channel for removing liquid from the second liquid carrier, and a second gas treatment section with a gas supply nozzle for supplying gas towards the peripheral area, which has been treated with the second liquid for removing most of the second liquid from the peripheral area, and with a gas discharge channel for discharging gas and removed liquid.

With such a device a wafer-shaped article can simultaneously be treated with two different liquids basically without mixing the two liquids.

For instance an etching liquid can be supplied towards a first section of the peripheral region, wherein the etching liquid wets only this first specific section of the peripheral region. This first specific section corresponds in shape and form to the first liquid carrier. By rotating the wafer-shaped article the wetted section moves along the peripheral region of the wafer-shaped article. The majority of the liquid is removed by surface tension. In other words the peripheral area moves through the liquid zone, which is provided by the liquid carrier. Liquid is permanently supplied to the liquid zone of the liquid carrier and removed therefrom. Thus the liquid in or on the liquid carrier is permanently renewed. If liquid residues remain on the peripheral area of the wafer-shaped article (after leaving the liquid zone in the liquid carrier), a smaller amount of liquid will be removed through the liquid discharge channel than has been supplied by the supply nozzle.

The liquid residues, which remain on the peripheral area, may further treat (etch or react with) the peripheral area until the peripheral area drives through the second liquid zone provided by the second liquid carrier. Liquid treatment in the second liquid carrier takes place in the same way as in the first carrier. After the liquid treatment liquid residues are blown off the peripheral area and the gas including the possibly generated mist are discharged through a gas discharging nozzle.

If the second liquid is a rinsing liquid the peripheral area of the wafer-shaped article remains clean and dry after leaving the second liquid treatment unit and before it immerses again into the liquid zone of the first liquid carrier.

With the device according to the invention it is also possible to treat the peripheral area of the wafer-shaped article with two different etching liquids which must not or cannot be supplied simultaneously. The first liquid may be an oxidizing liquid (e.g. a per sulphate solution) and the second may be an organic liquid (e.g. THF, or IPA).

With both the first as well as the second liquid treatment unit the liquid carrier may be formed as a plate placed in parallel to the wafer-shaped article's surface so that a gap is formed between the liquid carrier and the respective section of the peripheral area of the wafer-shaped article. Liquid is thus held by capillary forces between the liquid carrier and the wafer. Therefore the liquid zone remains at the liquid carrier.

In a preferred embodiment no rollers are arranged between the first liquid treatment unit and the second liquid treatment unit. This has the advantage that the residues of the first liquid, which has been supplied to the peripheral area, do not contact a roller. Therefore the rollers always drive the dry and clean edge of the wafer-shaped article.

Advantageously the second liquid treatment unit is configured to treat a greater peripheral area than the first liquid treatment unit. Therefore not only the peripheral area, which has been treated by the first liquid treatment unit, is treated by the second liquid treatment unit but also an area, which reaches more inwardly than the peripheral area, which has been treated by the first liquid treatment unit. Consequently the inner boundary of the first liquid treatment is treated from both sides.

In another embodiment the first liquid treatment unit further comprises a gas treatment section with a gas supply nozzle for supplying gas towards the peripheral area, which has been treated with the first liquid, for removing most of the first liquid from the peripheral area, and with a gas discharge channel for discharging gas and removed liquid.

With another embodiment at least one liquid carrier has the form of a groove open towards the centre of the wafer-shaped article, wherein the groove has a maximum width of 3 mm. If a wafer-shaped article is present the wafer-shaped article's edge is inserted into the groove without touching the groove's sidewalls. The groove envelopes the wafer-shaped article's edge. When liquid is supplied into the groove it is held by capillary forces without dripping off the groove. This effect is further supported when the wafer-shaped article's edge is present in the groove. Given that the wafer-shaped article has a thickness of about 0.6 mm and it is held in the centre of the groove the gaps between the sidewalls of the groove and the wafer-shaped article are about 1.2 mm at the maximum, which are small enough so that liquids of low surface tension can be held by capillary forces.

In yet another embodiment with at least one liquid treatment unit both the liquid carrier and the liquid removal section have the form of a groove open towards the centre, wherein the width of the groove of the liquid carrier is smaller than the width of the groove of the liquid removal section by at least 1 mm. This leads to the advantageous effect that liquid, which is held by capillary forces in the liquid carrier is not held by the liquid removal section. Liquid is thus retained in the liquid carrier when the wafer-shaped article's edge moves towards the liquid removal section. In other words the capillary breaks when the edge leaves the liquid carrier and most of the liquid remains in the liquid carrier's groove.

In another embodiment at least one gas treatment section comprises at least two gas supply nozzles opposing each other with respect to the wafer-shaped article. This is advantageous because if gas nozzles are used at only one side of the wafer-shaped article it might occur that liquid, which has been blown off a first side, may move over the edge to the second side of the wafer-shaped article.

Advantageously the holding means for holding and rotating the wafer-shaped article comprise at least one roller unit, which comprises at least two rollers. This helps to rotate a wafer-shaped article e.g. when it has a notch at its edge (e.g. a semiconductor wafer). In this case preferably at least one roller unit comprises at least one roller, which is driven by a motor.

Advantageously at least one liquid treatment unit is mounted to the drive unit so that the liquid treatment unit is movable to and from the edge of the wafer-shaped article together with the roller unit. This helps to adjust the liquid treatment unit with respect to the edge almost independently of the diameter of the wafer-shaped article.

In one embodiment of the invention the first liquid supply nozzle and the second liquid supply nozzle are arranged at a distance of at least 10 cm measured at the circumference of the wafer-shaped article.

In another embodiment a spin chuck and a chamber surrounding the spin chuck are arranged underneath the rollers so that the spin chuck can receive a wafer-shaped article directly from the rollers. With such an arrangement the wafer-shaped article can be treated at its edge immediately before or after a full-surface treatment without the necessity of further handling.

Alternatively the one liquid treatment unit can be equipped with an ultrasonic transducer for further agitation of the liquid in order to enhance the liquid treatment (e.g. removal of a layer).

Another aspect of the invention is a process for treating a peripheral area of a wafer-shaped article comprising:
holding and rotating the wafer-shaped article at its edge with holding means,
wherein the holding means comprise rollers for driving the wafer-shaped article at its edge
supplying a first liquid towards a first section of the peripheral area with a first liquid treatment unit,
wherein the supplying of the first liquid comprises:

wetting the first section of the peripheral area with the first liquid, so that the section of the peripheral area moves along the peripheral area of the wafer-shaped article as the wafer-shaped article rotates,
removing most of the first liquid;
supplying a second liquid towards a second section of the peripheral area with a second liquid treatment unit,
wherein the supplying of the second liquid comprises:
wetting the second section of the peripheral area with the second liquid, so that the section of the peripheral area moves along the peripheral area of the wafer-shaped article as the wafer-shaped article rotates,
supplying gas towards a section of the peripheral area, which has been treated with the second liquid, for removing residues of the second liquid from the peripheral area, and
discharging supplied gas and removed liquid.

Thereby the wafer-shaped article's peripheral region can be treated with at least two liquids wherein both liquids are supplied to the wafer-shaped article simultaneously and wherein the liquids are repeatedly supplied to the specific point of the peripheral region one after the other. Each point of the peripheral region is sequentionally repeatedly wetted with different liquids, whereby each liquid is basically removed before the other liquid is supplied.

In a preferred embodiment according to the invention the process further comprises supplying gas towards a section of the peripheral area, which has been treated with the first liquid, for removing residues of the first liquid from the peripheral area, and discharging supplied gas and removed first liquid. This further reduces residues of the first liquid after the first liquid has been supplied.

Advantageously the first liquid is provided by a stationary first liquid carrier, which comprises a first liquid supply nozzle for supplying liquid to the first liquid carrier, and a first liquid discharging channel for removing liquid from the first liquid carrier.

If the edge of the wafer-shaped article does not touch a roller after it has been treated by the first liquid and before it is treated by the second liquid the first liquid cannot contaminate a roller, which is preferred when very aggressive etching compositions are used as the first liquid.

In one embodiment of the process the wafer-shaped article rotates at a spin speed in a range of 1 rpm to 60 rpm.

In another embodiment of the process the first liquid supply nozzle and the second liquid supply nozzle are arranged at a selected distance to each other and the spin speed is set to a respective value so that the time between the first liquid has been removed and the second liquid is supplied lays in a range of 1 s to 10 s.

Further details of the invention will became apparent with the following description and the associated drawings.

BRIEF DESCRIPTION OF DRAWINGS

FIG. 7 shows details of a liquid treatment unit in a front view in direction VII-VII as shown in FIG. 2.

FIG. 8 shows a cross-sectional view of the device shown in FIG. 1

BEST MODE FOR CARRYING OUT THE INVENTION

Figure 1:
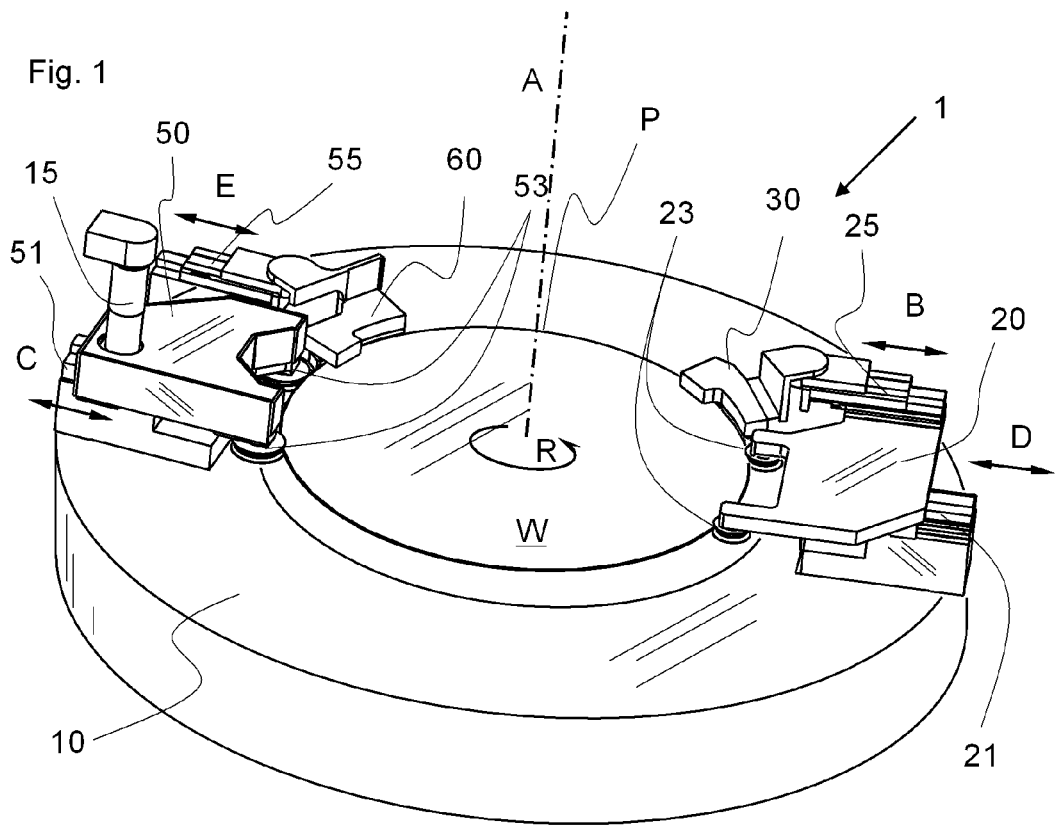
FIG. 1 shows a schematic perspective view of a device according to a preferred embodiment of the current invention.

FIG. 1 shows a device 1 for treating a peripheral area P of a wafer W. The device comprises an annular chamber 10 for accepting a wafer W. On top of the chamber 10 a roller unit 20 is mounted to the chamber 10 with a linear moving unit 21 and a drive unit 50 is mounted to the chamber 10 with a linear moving unit 51. The roller unit 20 and the drive unit 50 are substantially opposing each other with respect to the rotational axis A of a wafer when being treated.

The linear moving unit 21 can move the roller unit 20 along direction D, which is substantially perpendicular to the rotational axis A. The linear moving unit 51 can move the drive unit 50 along direction C, which is substantially perpendicular to the rotational axis A.

The roller unit 20 comprises non-driven rollers 23 mounted to downwardly projecting axes.

The drive unit 50 comprises a motor 15, which drives the driven rollers 53, which are mounted to downwardly projecting axes. The axes are driven by a driving belt (not shown).

The driven rollers 53 as well as the non-driven rollers 23 comprise a circumferential groove.

When roller unit 21 and drive unit 51 are moved towards each other a wafer W placed between the rollers 23 and 53 is gripped.

To the roller unit 21 a linear moving unit 25 is mounted for linear movement B of first liquid treatment unit 30. Linear movement B is carried out perpendicular to the rotational axis A.

To the drive unit 51 a linear moving unit 55 is mounted for linear movement E of second liquid treatment unit 60. Linear movement E is carried out perpendicular to the rotational axis A.

The drive unit 51 drives the wafer W in the direction R.

Both the first liquid treatment unit 30 and the second liquid treatment unit 60 basically look the same, which is further described with reference to the FIGS. 2, 3, 4, 5, 6 and 7.

Figure 2:
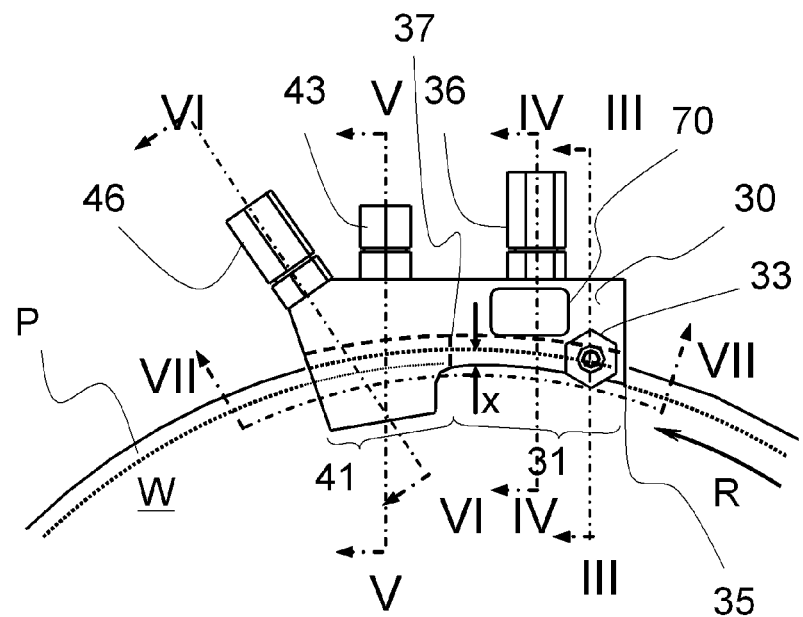
FIG. 2 shows a top view of a liquid treatment unit.

FIG. 2 shows a top view whereas FIG. 3-6 show cross-sectional side views as mentioned above.

The liquid treatment unit comprises a liquid treatment section 31 and a gas treatment section 41.

The liquid treatment section 31 comprises a liquid supply pipe 33, and a liquid discharge pipe 36. The liquid treatment section 31 extends from the entrance 35 into the liquid zone to the exit 37 from the liquid zone.

The gas treatment section 41 comprises a gas supply pipe 43, and a gas discharge pipe 46.

The liquid treatment is carried out at a width X of liquid treated peripheral area of wafer W.

Figure 3:
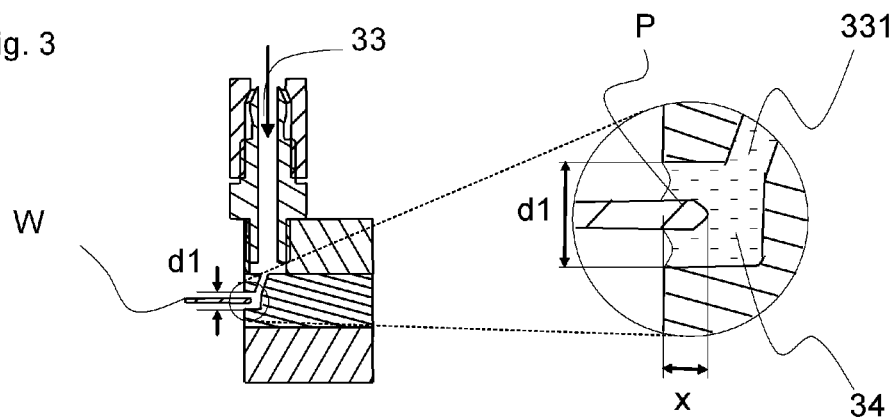
FIG. 3 shows details of a liquid treatment unit in a cross-sectional side view in direction III-III as shown in FIG. 2.

FIG. 3 shows a vertical cross-section of the liquid treatment section 31 through the liquid supplying pipe 33 and an enlarged view with the liquid filled capillary 34. The capillary 34 (the liquid carrier) is an inwardly open groove with a width d1 of 2 mm. The wafer W is inserted into the capillary 34 without touching it, so that wafer and groove overlap at a width X. Therefore the peripheral region P is treated. Liquid supplied by liquid supply pipe 33 is introduced into the groove 34 by the liquid supply nozzle 331.

Figure 4:
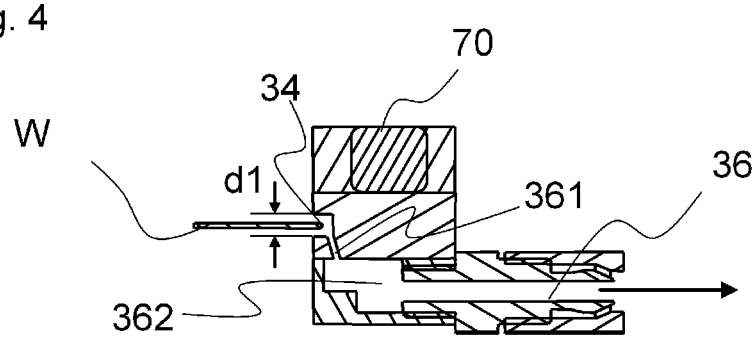
FIG. 4 shows details of a liquid treatment unit in a cross-sectional side view in direction IV-IV as shown in FIG. 2.

FIG. 4 shows a vertical cross-section of the liquid treatment section 31 through the liquid filled capillary 34 and the liquid discharge pipe 36. Liquid is discharged through the liquid discharge nozzle 361 into the liquid collecting chamber 362 and further through the liquid discharge pipe 36. The liquid discharge pipe is connected to a vacuum source. The width d1 of capillary (width of groove of liquid carrier) is the same as at the liquid supply nozzle 331.

Optionally an ultrasonic transducer 70 is attached to the liquid treatment unit.

Figure 5:
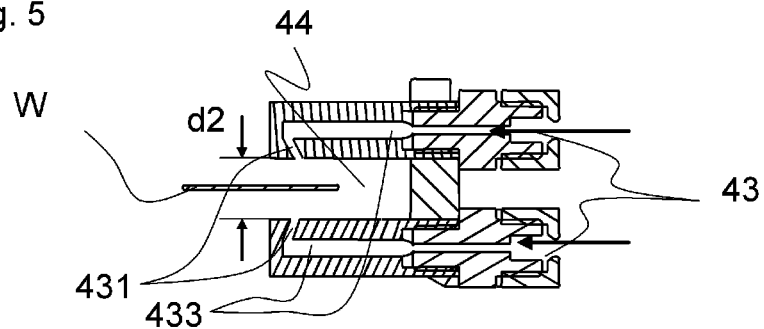
FIG. 5 shows details of a liquid treatment unit in a cross-sectional side view in direction V-V as shown in FIG. 2.

FIG. 5 shows a vertical cross-section of the gas treatment section 41 through the gas treatment groove 44 and the first set of gas supply nozzles 431. The gas treatment groove 44 has a width d2 of 4 mm, which is significantly greater than d1. When the wafer W is rotating the liquid, which is held by the capillary 34, does not move to the gas treatment groove 44 because of the step between capillary 34 and groove 44. The liquid is rather withheld in the capillary 34.

The gas is supplied through the gas supply pipes 43 into the gas distribution channel 433 and directed towards the wafer's peripheral area from both sides through the gas supply nozzles 431.

Figure 6:
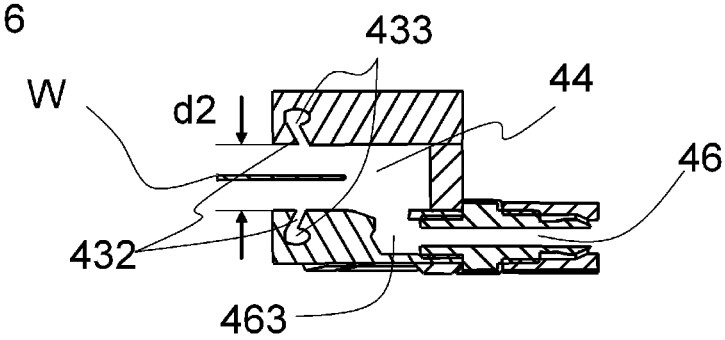
FIG. 6 shows details of a liquid treatment unit in a cross-sectional side view in direction VI-VI as shown in FIG. 2.

FIG. 6 shows a vertical cross-section of the gas treatment section 41 through the gas discharge pipe 46 and the second set of gas supply nozzles 432. The second set of gas supply nozzles 432 is also supplied through the gas distribution channel 433. Gas and mist are removed by gas discharge nozzle 463 and gas discharge pipe 46, which is connected to a vacuum source.

FIG. 7 shows a front view of the liquid treatment unit 30 from the centre.

The liquid treatment unit comprises a liquid treatment section 31 and a gas treatment section 41.

The liquid treatment section 31 extends from the entrance 35 into the liquid zone to the exit 37 from the liquid zone. The exit 37 out of the liquid zone is formed as a step with a sharp edge (in this case 90°). Therefore liquid is held between the entrance 35 and the exit 37.

FIG. 8 shows a cross-sectional view of the device 1 in FIG. 1. The device comprises an annular chamber 10 for accepting a wafer W. On top of the chamber 10 a roller unit 20 and a drive unit 50 are mounted to the chamber 10. A spin chuck 11 (e.g. as described in U.S. Pat. No. 5,513,668) is placed in the centre of the chamber 10. The spin chuck is vertically movable (V) along its rotation axis A. The spin chuck 11, the roller unit 20 and the drive unit 50 are configured and arranged to each other so that spin chuck 11 can directly receive a wafer W when it is held between the roller unit 20 and drive unit 50. When the wafer W is gripped by the pins of the spin chuck 11 the roller unit 20 and the drive unit 50 are moved away from the wafer W in direction C and D respectively.

Following two typical processes for edge wet treatment of a wafer are described:

EXAMPLE 1

A Process for Removing a Silicon Oxide Layer from the Edge with Diluted Hydrogen Fluoride (dHF)

A wafer is loaded from above (with an edge-contact-only gripper such as described e.g. in U.S. Pat. No. 5,762,391) between the roller unit 20 and the drive unit 50. The roller unit 20 and the drive unit 50 are moved towards each other so that their rollers grip the wafer. After loading the wafer is turned with a spin speed of 5 rpm.

The liquid carrier of the first liquid treatment unit 30 is filled with dHF at 25° C. The liquid (dHF) in the first liquid carrier is renewed at a flow of 5 ml/min.

When the wafer W is rotated the second liquid treatment unit 60, which is filled with deionised water at 25° C., is moved towards the wafer's edge. Simultaneously or immediately thereafter the first liquid treatment 30 unit is moved to the edge of the wafer. The liquid (deionised water) in the second liquid carrier is renewed at a flow of 10 ml/min.

The drying inert gas (in this example nitrogen), with is supplied through the gas supply nozzles is switched on in both liquid treatment units with an individual adjusted flow (15 l/min for the gas treatment at the first liquid treatment unit and 5 l/min for the gas treatment at the second liquid treatment unit). The process area (peripheral area) on the wafer is set to 1 mm (X=1 mm) on the front side (lower side) as well as on the back side (upper side) of the wafer. The selected groove of liquid carrier of the first liquid treatment unit is formed accordingly and is placed at the appropriate distance.

The process area of the second liquid carrier is slightly greater than the first process area to ensure that all eventual remaining acid is rinsed and dried. After the required process time (1 min) has elapsed, the liquid flow of the first liquid is switched off and remaining liquid is sucked out of the first liquid carrier. Thereafter the first liquid treatment unit is removed (direction B). The second liquid treatment unit is still rinsing and drying until the last processed part of the wafer passed the second liquid treatment unit. Thereafter the second liquid treatment unit 60 is removed (direction E). After the second liquid treatment unit 60 has been removed, rotation of the wafer W is stopped, and the spin chuck 11 picks up the wafer W from the rollers 23, 53. Regular applications on the front side and/or on the back side of the wafer can be performed e.g. where liquid is supplied through the liquid dispenser 12.

EXAMPLE 2

Process for Edge Polymer Removal

The process is carried out basically in the same way as in example 1 with the following deviations.

The liquid used in the first liquid treatment unit is a mixture of sulphuric acid and hydrogen peroxide.

Ultrasonic agitation is applied to the edge through transducers 70 at 300 kHz.

The groove of the liquid carrier is formed such that the upper side of the wafer is treated at a peripheral area of 1 mm (X=1 mm) and the lower side is treated at a peripheral area of 3 mm (X=3 mm). Therefore the liquid carrier has the shape of an asymmetric groove with sidewalls of different height or rather depth (e.g. the upper side wall has a depth of 1.5 mm whereas the lower side wall has a depth of 3.5 mm).

The liquid used in the first liquid treatment unit is supplied at a temperature of 55° C.

The second liquid treatment unit has a second liquid carrier of about the same shape as the first liquid carrier, however reaching slightly more inward than the first liquid carrier.

To further support the reaction time of the first liquid it is not removed by inert gas in the first liquid treatment unit but rather remains on the wafer until the second liquid treatment unit rinses the first liquid (acid mixture).

The invention claimed is:

1. Process for treating a peripheral area of a wafer-shaped article comprising:
   holding the wafer-shaped article at its edge and rotating the wafer-shaped article about an axis A with holding means, wherein the holding means comprise rollers for driving the wafer-shaped article at its edge,
   supplying a first liquid towards a first section of the peripheral area with a first liquid treatment unit, wherein the supplying of the first liquid comprises:
   wetting the first section of the peripheral area with the first liquid, so that the section of the peripheral area moves along the peripheral area of the wafer-shaped article as the wafer-shaped article rotates,
   removing most of the first liquid;
   supplying a second liquid towards a second section of the peripheral area with a second liquid treatment unit, wherein the supplying of the second liquid comprises:
   wetting the second section of the peripheral area with the second liquid, so that the section of the peripheral area moves along the peripheral area of the wafer-shaped article as the wafer-shaped article rotates,
   supplying gas from a gas treatment section positioned circumferentially adjacent to the second liquid treatment unit with respect to a circle centered on and perpendicular to axis A, towards the wetted second section of the peripheral area, for removing residues of the second liquid from the peripheral area, and
   discharging supplied gas and removed liquid;
   wherein the first and second liquids are different from one another and are dispensed simultaneously onto the wafer-shaped article without substantial mixing of the first and second liquids.

2. Process according to claim 1, which further comprises supplying gas towards a section of the peripheral area, which has been treated with the first liquid, for removing residues of the first liquid from the peripheral area, and discharging supplied gas and removed first liquid.

3. Process according to claim 1 wherein the first liquid is provided by a stationary first liquid carrier which comprises a first liquid supply nozzle for supplying liquid to the first liquid carrier,
   a first liquid discharging channel for removing liquid from the first liquid carrier.

4. Process according to claim 1 wherein the edge of the wafer-shaped article does not touch a roller after it has been treated by the first liquid and before it is treated by the second liquid.

5. Process according to claim 1 wherein the wafer-shaped article rotates at a spin speed in a range of 1 rpm to 60 rpm.

6. Process according to claim 1 wherein a first liquid supply nozzle and a second liquid supply nozzle are arranged at a selected distance to each other and the spin speed is set to a respective value so that the time between the first liquid has been removed and the second liquid is supplied lays in a range of 1 s to 10 s.

* * * * *